(12) United States Patent
Xue et al.

(10) Patent No.: US 9,754,638 B1
(45) Date of Patent: Sep. 5, 2017

(54) SENSE AMPLIFIER

(71) Applicant: Marvell International Ltd., Hamilton (BM)

(72) Inventors: Qikun Xue, San Jose, CA (US); Zhendong Guo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/226,201

(22) Filed: Aug. 2, 2016

Related U.S. Application Data

(60) Provisional application No. 62/200,761, filed on Aug. 4, 2015.

(51) Int. Cl.
*G11C 7/06* (2006.01)
*H04L 12/26* (2006.01)
*H04B 1/16* (2006.01)
*H03F 3/45* (2006.01)

(52) U.S. Cl.
CPC .............. *G11C 7/06* (2013.01); *G11C 7/062* (2013.01); *H03F 3/45* (2013.01); *H04B 1/16* (2013.01); *H04L 43/028* (2013.01)

(58) Field of Classification Search
CPC .. G11C 7/06; G11C 7/062; H04B 1/16; H03F 3/45; H03F 2200/222
See application file for complete search history.

(56) References Cited

U.S. PATENT DOCUMENTS

| 4,352,072 | A | * | 9/1982 | Harrington | H03F 1/08 330/124 R |
| 4,926,134 | A | * | 5/1990 | Olver | H03F 1/3229 330/149 |
| 5,287,069 | A | * | 2/1994 | Okubo | H03F 1/0294 330/10 |
| 5,528,196 | A | * | 6/1996 | Baskin | H03F 1/3235 330/151 |
| 5,576,659 | A | * | 11/1996 | Kenington | H03F 1/3235 330/149 |

(Continued)

OTHER PUBLICATIONS

Jaeha Kim, et al., Members, IEEE; Simulation and Analysis of Random Decision Errors in Clocked Comparators; IEEE Transactions on Circuits and Systems—I: Regular Papers, vol. 56, No. 8, pp. 1844-1857, Aug. 2009.

(Continued)

*Primary Examiner* — Jean B Corrielus

(57) ABSTRACT

Aspects of the disclosure provide a sense amplifier that includes a first amplifying circuit, a second amplifying circuit, a coupling circuit and a detection circuit. The first amplifying circuit is configured to receive an input signal that carries digital values and amplify the input signal to generate a first output. The coupling circuit is configured to combine the input signal with an offset signal to form a combined signal. The offset signal is used to cancel an offset of the first amplifying circuit. The second amplifying circuit is configured to receive the combined signal of the input signal and the offset signal and amplify the combined signal to generate a second output. The first output and the second output are combined to form a combined output. The detection circuit is configured to detect the digital values based on the combined output.

20 Claims, 6 Drawing Sheets

(56) References Cited

U.S. PATENT DOCUMENTS

| | | | | | |
|---|---|---|---|---|---|
| 5,977,826 | A | * | 11/1999 | Behan | H03F 1/30 330/149 |
| 6,229,840 | B1 | * | 5/2001 | Ichihara | H04B 7/0894 375/147 |
| 7,058,003 | B2 | * | 6/2006 | You | H04B 1/7073 370/203 |
| 7,116,167 | B2 | * | 10/2006 | Ahn | H03F 1/3229 330/149 |
| 7,684,513 | B2 | * | 3/2010 | Ikeda | H03F 1/0294 330/52 |
| 8,411,778 | B1 | * | 4/2013 | Lee | H04L 1/08 370/203 |
| 8,463,202 | B2 | * | 6/2013 | Nagayama | H03F 1/0294 455/108 |
| 8,611,455 | B2 | * | 12/2013 | Stirling-Gallacher | H04B 7/0408 375/259 |
| 8,933,749 | B2 | * | 1/2015 | Lee | G11C 7/06 327/307 |
| 2016/0261254 | A1 | * | 9/2016 | Peschke | H03K 5/003 |

OTHER PUBLICATIONS

Behzad Razavi, The StrongARM Latch; IEEE Solid-State Circuits Magazine, pp. 12-17, Spring 2015.

* cited by examiner

SENSE AMPLIFIER

INCORPORATION BY REFERENCE

This present disclosure claims the benefit of U.S. Provisional Application No. 62/200,761, "STRONG ARM SENSING AMPLIFIER" filed on Aug. 4, 2015, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Sense amplifiers are used in various applications, such as a memory circuit, a serializer/deserializer (SERDES) circuit, and the like. For example, a SERDES circuit generally includes a transmitter circuit and a receiver circuit. The receiver circuit includes a sense amplifier to receive a pair of differential signals, amplify the differential signals and detect information carried in the differential signals.

SUMMARY

Aspects of the disclosure provide a sense amplifier that includes a first amplifying circuit, a second amplifying circuit, a coupling circuit and a detection circuit. The first amplifying circuit is configured to receive an input signal that carries digital values and amplify the input signal to generate a first output. The coupling circuit is configured to combine the input signal with an offset signal to form a combined signal. The offset signal is used to cancel an offset of the first amplifying circuit. The second amplifying circuit is configured to receive the combined signal of the input signal and the offset signal and amplify the combined signal to generate a second output. The first output and the second output are combined to form a combined output. The detection circuit is configured to detect the digital values based on the combined output.

In an embodiment, the coupling circuit includes a high pass filter configured to pass frequency components in the input signal that are higher than a cutoff frequency. Further, the coupling circuit includes a low pass filter configured to pass a DC component in the offset signal, the DC component in the offset signal and the passed frequency components in the input signal are combined to form the combined signal.

In an example, the first amplifying circuit is configured to generate a first current in response to input signal. The second amplifying circuit is configured to generate a second current in response to the combined signal. The first current and the second current are combined to form a combined current. The detection circuit is configured to detect the digital values based on the combined current. In an example, the detection circuit includes two inverters that are cross-coupled to form a latch. The first amplifying circuit includes a first differential amplifier, the second amplifying circuit includes a second differential amplifier, and the first differential amplifier and the second differential amplifier are coupled with the latch.

In an embodiment, the sense amplifier includes a storage memory configured to store offset information of the first amplifying circuit in a digital form, and a digital to analog converter configured to generate the offset signal in an analog form based on the stored offset information in the digital form.

Aspects of the disclosure provide a method for receiving and detecting digital values. The method includes receiving an input signal that carries digital values, amplifying the input signal, by a first amplifying circuit, to generate a first output, combining the input signal with an offset signal that is used to cancel an offset of the first amplifying circuit to form a combined signal, amplifying the combined signal, by a second amplifying circuit, to generate a second output, combining the first output and the second output to form a combined output and detecting the digital values based on the combined output.

Aspects of the disclosure provide an apparatus that includes a serializer/deserializer (SERDES) circuit. The SERDES circuit includes a receiver circuit configured to receive input signals and detect digital vales carried in the input signals. The receiver circuit includes a sense amplifier. The sense amplifier includes a first amplifying circuit configured to receive the input signals and amplify the input signals to generate first outputs, and a coupling circuit configured to combine the input signals with offset signals to form combined signals. The offset signals are used to cancel an offset of the first amplifying circuit. The sense amplifier also includes a second amplifying circuit configured to receive the combined signals and amplify the combined signals to generate second outputs, and a detection circuit configured to detect the digital values based on combined outputs of the first outputs and the second outputs.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
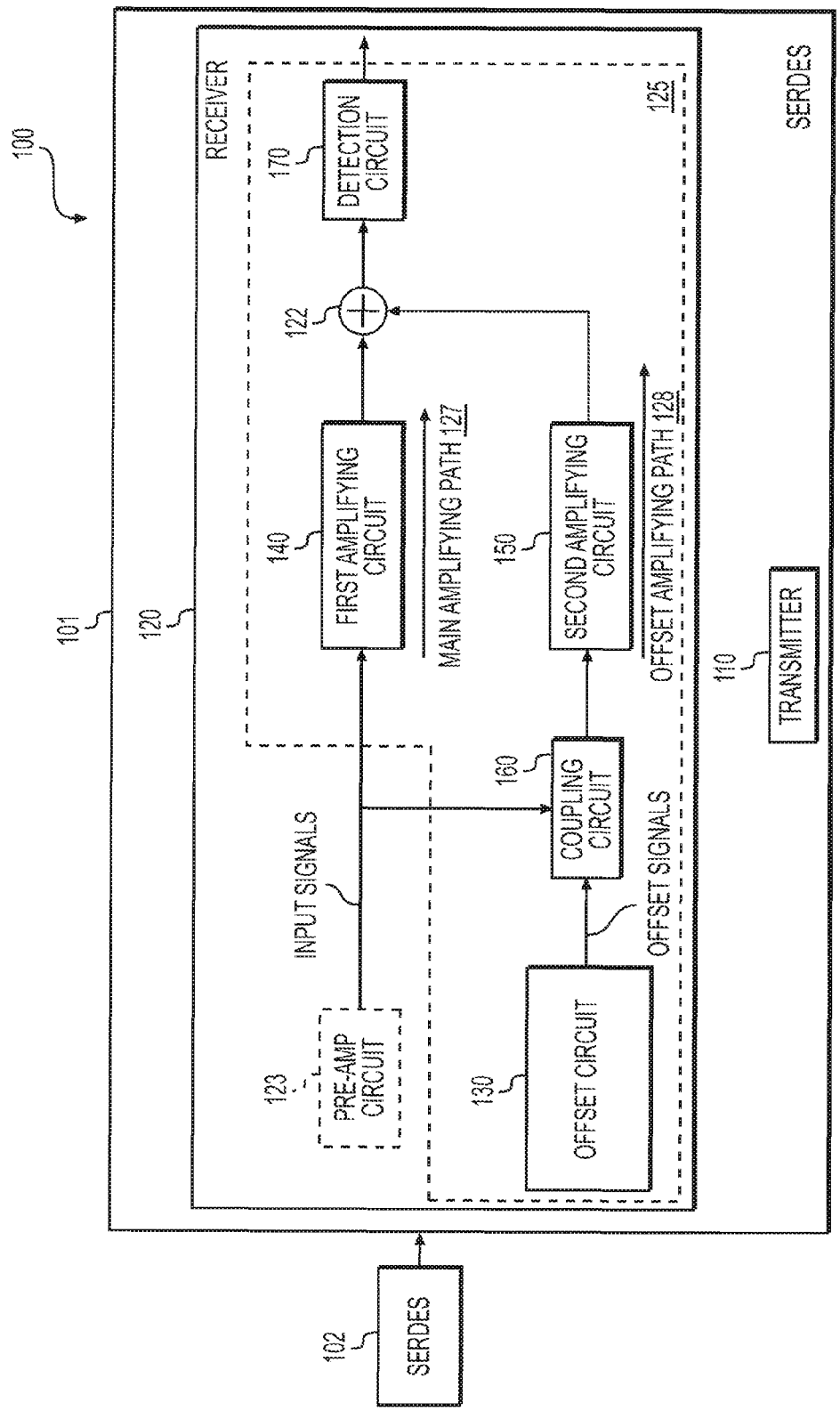
FIG. 1 shows a block diagram of an electronic system 100 according to an embodiment of the disclosure.

FIG. 1 shows a block diagram of an electronic system 100 according to an embodiment of the disclosure. The electronic system 100 includes a sense amplifier circuit 125. The sense amplifier circuit 125 is configured to receive a pair of differential signals that carry digital values, amplify the differential signals, and detect the digital values that are carried by the differential signals. The sense amplifier circuit 125 includes a first amplifying circuit 140, a second amplifying circuit 150, and a coupling circuit 160. These elements are coupled together as shown in FIG. 1.

In an example, the first amplifying circuit 140 is in a main amplifying path 127 configured to amplify the differential signals with a relatively large gain, and the second amplifying circuit 160 is in an offset amplifying path 128 configured to amplify offset signals to cancel offset in the main amplifying path 127. In addition, in an embodiment, the coupling circuit 160 couples the differential signals to the offset amplifying path 128 to be combined with the offset signals, thus the second amplifying circuit 160 amplifies the combined signals of the offset signals and the differential signals.

The electronic system 100 is any suitable electronic system that includes a sense amplifier circuit 125. In an embodiment, the electronic system 100 is a communication system that uses differential signals to transmit digital data. In an example, the electronic system 100 includes a first serializer/deserializer (SerDes) 101 and a second serializer/deserializer (SerDes) 102. The first SerDes 101 and the second SerDes 102 communicate with each other using differential signals.

In an example, the first SerDes 101 is arranged at an interface of an electronic device such as a desktop computer, a laptop computer, a tablet computer, a network switch device, a network bridge device, a network router device and the like, and the second SerDes 102 is arranged in an external device to the electronic device, such as a universal serial bus (USB) device. The first SerDes 101 in the electronic device and the second SerDes 102 in the external device are coupled together via a USB cable for example.

In another example, the first SerDes 101 is disposed in a first integrated circuit (IC) chip, and the second SerDes 102 is disposed in a second IC chip. The two IC chips are mounted on a printed circuit board (PCB). The first SerDes 101 and the second SerDes 102 are coupled together via copper lines that are printed on the PCB for example.

In another example, the first SerDes 101 and the second SerDes 102 are circuit modules in a same IC chip. The first SerDes 101 and the second SerDes 102 are coupled together via on chip interconnections, such as metal lines, and the like.

According to an aspect of the disclosure, each of the SerDes circuits 101 and 102 includes a transmitter circuit and a receiver circuit. For example, the first SerDes 101 includes a transmitter circuit 110 and a receiver circuit 120. The transmitter circuit 110 is configured to transmit a pair of differential signals to carry digital values, such as binary bits, and the receiver circuit 120 is configured to receive a pair of differential signals that carry digital values, such as binary bits. The receiver circuit 120 includes the sense amplifier circuit 125 configured to amplify the differential signals and detect the digital values, such as the binary bits, that are carried in the differential signals.

According to an aspect of the disclosure, the sense amplifier circuit 125 is implemented using complementary metal-oxide-semiconductor (CMOS) technology. In CMOS technology, the offset voltage, due to mismatch of the devices, limits precision and sensitivity of a sense amplifier. Thus, a DC offset cancellation circuit is necessary in a sense amplifier, especially in high-precision and high-sensitivity application.

Specifically, in the FIG. 1 example, the sense amplifier circuit 125 includes the first amplifying circuit 140, the second amplifying circuit 150, the coupling circuit 160, an offset circuit 130, and a detection circuit 170 coupled together as shown in FIG. 1. According to an aspect of the disclosure, the sense amplifier circuit 125 is configured to use offset cancellation circuit (e.g., the second amplifying circuit 150) for feed-forward equalization.

The first amplifying circuit 140 is the main amplifying circuit path with a relatively large gain compared to the second amplifying circuit 150. In an embodiment, the first amplifying circuit 140 includes a differential amplifier configured to have a relatively large gain. The differential amplifier has random DC offset due to various reasons, such as process variation, temperature variation, voltage variation and the like. The random DC offset can cause data detection errors especially in the low power applications. The second amplifier circuit 150 and the offset circuit 130 are coupled together to calibrate the random DC offset, store offset information, and cancel the random DC offset in the first amplifying circuit 140 during operation.

In an example, at a time of powering up an electronic device in which the first SerDes 101 is located, the electronic device performs a calibration process to calibrate the first SerDes 101 and to determine the offset information to cancel the random DC offset in the first amplifying circuit 140. For example, inputs having zero difference are provided to the first amplifying circuit 140, and offset signals are suitably adjusted to make combined outputs from the first amplifying circuit 140 and the second amplifying circuit 150 to have zero difference.

In an example, the offset information is digitalized and stored in a digital form, for example, in a memory in the offset circuit 130. Then, when the receiver circuit 120 receives and processes input signals, the offset circuit 130 converts the stored offset information into an analog form to generate analog offset signals. The analog offset signals are then suitably processed (e.g., filtered, combined with other signals) and provided to the second amplifying circuit 150. The second amplifying circuit 150 amplifies the analog offset signals. Offset in the first amplifying circuit 140 is cancelled by combining the amplified analog offset signals with output from the first amplifying circuit 140.

According to an aspect of the disclosure, the coupling circuit 160 couples the input signals to the offset amplifying path 128 and combines the input signals with the analog offset signals to generated combined signals. The combined signals are amplified by the second amplifying circuit 150. In an embodiment, the coupling circuit 160 is configured to respectively filter the analog offset signals and the input signals, respectively select frequency components from the analog offset signals and the input signals, and combine the selected portions together for amplification on the offset amplifying path 128.

In an example, the coupling circuit 160 includes a high pass filter and a low pass filter. The high pass filter is configured to filter the input signals and pass the frequency components that are higher than a cutoff frequency to the offset amplifying path 128. In an example, the cutoff frequency is determined based on transmission characteristics, such as clock frequency, encoding techniques, and the like, thus the frequency components that are used to transmit the digital values are passed to the offset amplifying path 128. Further, the low pass filter is configured to filter the analog offset signals and pass the DC frequency component, thereby filtering out noise due to digital to analog conversion.

In the example, the DC frequency component in the analog offset signals is combined with the high frequency components in the input signals. The combined signals are amplified by the second amplifying circuit 150. The high pass filter and the second amplifying circuit 150 operate together similarly to a feed forward equalizer, in an embodiment. Thus, in the example, the sense amplifier circuit 125 reduces inter symbol interference (ISI) during data transmission and improves signal noise ratio (SNR) in the SerDes application.

Further, in the FIG. 1 example, the output from the first amplifying circuit 140 and the second amplifying circuit 150 are combined and the combined signals are provided to the detection circuit 170 to detect the digital values. In an embodiment, the detection circuit 170 includes a latch circuit configured to determine binary values.

It is noted that, in an example, the receiver circuit 120 includes other suitable components. In an example, the receiver circuit 120 includes a preamplifier (pre-amp) circuit 123 configured to prepare the differential signals for further amplification. In another example, the receiver circuit 120 includes decoder circuit (not shown) after the detection circuit 170 to correct errors and extract information from the detected digital values.

Figure 2:
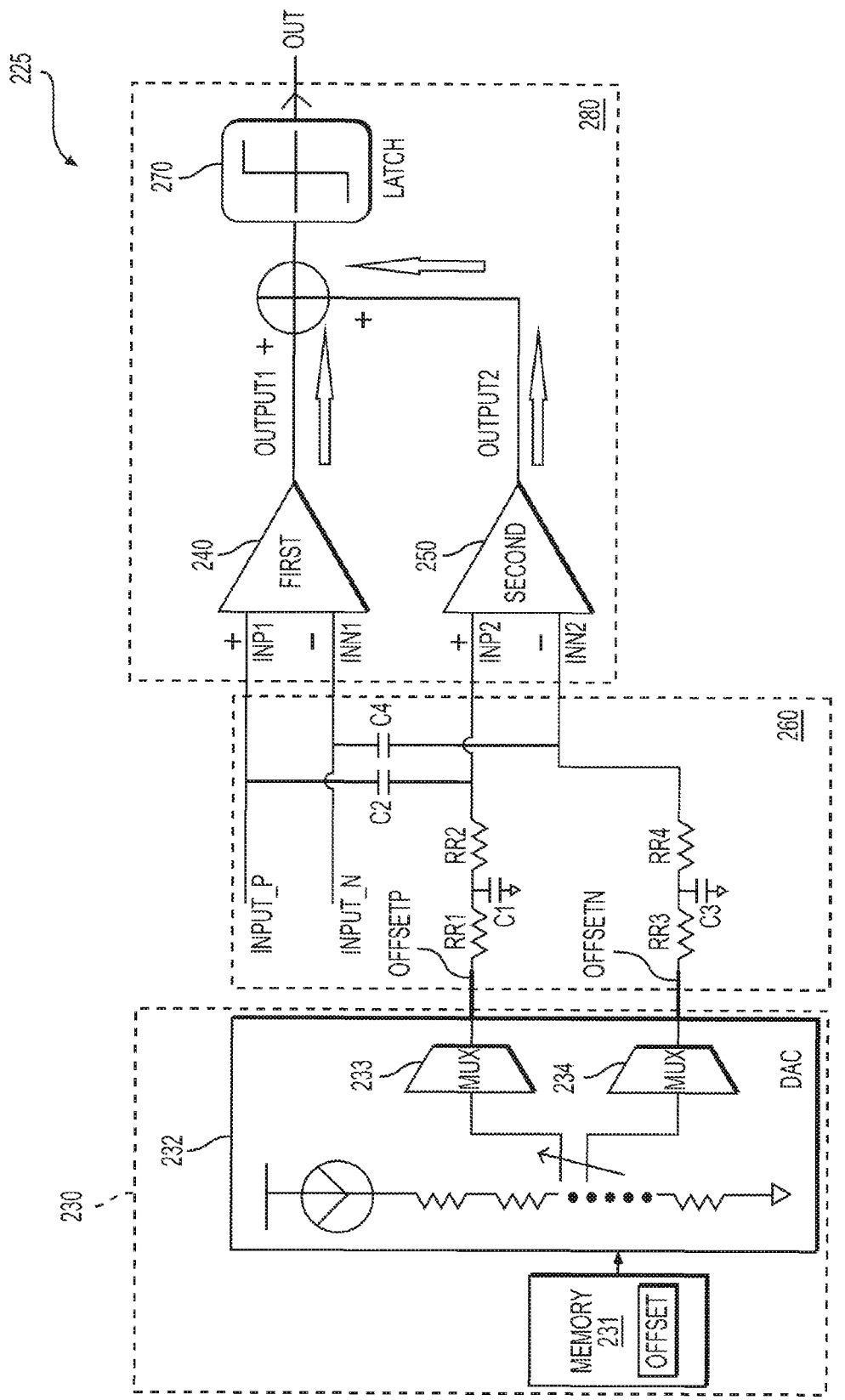
FIG. 2 shows a block diagram of an sense amplifier circuit 225 according to an embodiment of the disclosure.

FIG. 2 shows a block diagram of a sense amplifier 225 according to an embodiment of the disclosure. In an example, the sense amplifier 225 is a detail implementation of the sense amplifier circuit 125 and is used in the SerDes 101 in the place of the sense amplifier circuit 125. The sense amplifier 225 receives a pair of input signals INPUT_P and INPUT_N, and outputs a stream of digital values OUT. The sense amplifier 225 includes an offset circuit 230, a coupling circuit 260, a first amplifier 240, a second amplifier 250 and a latch 270 coupled together as shown in FIG. 2.

The offset circuit 230 includes a memory 231 and a digital to analog converter (DAC) 232 coupled together. The memory 231 is configured to store offset information in digital form, such as in the form of a plurality of binary bits and the like. The memory 231 is implemented using suitable storage device, such as registers, dynamic random access memory (DRAM), static random access memory (SRAM), flash memory, and the like.

The DAC 232 is configured to generate a pair of analog offset signals OFFSETP and OFFSETN based on the stored offset information. In the FIG. 2 example, the DAC 232 includes a plurality of resistors coupled in series between a high voltage and a low voltage to generate a plurality of divided voltages between the high voltage and the low voltage. Two of the divided voltages are selected according to the stored offset information. In an example, the DAC 232 includes two multiplexers 233 and 234. The multiplexer 233 receives the plurality of divided voltages as inputs, and is configured to select one of the inputs as the analog offset signal OFFSETP based on the stored offset information. Similarly, the multiplexer 234 receives the plurality of divided voltages as inputs, and is configured to select one of the inputs as the analog offset signal OFFSETN based on the stored offset information.

The input signals INPUT_P and INPUT_N are differential signals that are complementary to each other. The combination of input signals INPUT_P and INPUT_N carries digital values. For example, when the input signal INPUT_P has a higher voltage level than the input signal INPUT_N, the input signals INPUT_P and INPUT_N carry binary "1", and when the input signal INPUT_P has a lower voltage level than the input signal INPUT_N, the input signals INPUT_P and INPUT_N carry binary "0".

The input signals INPUT_P and INPUT_N are provided as input signals INP1 and INN1 to the first amplifier 240. The first amplifier 240 amplifies the input signals INP1 and INN1 to generate first outputs OUTPUT1.

The coupling circuit 260 is configured to suitably combine the pair of analog offset signals OFFSETP and OFFSETN with the pair of differential signals INPUT_P and INPUT_N. In the FIG. 2 example, the coupling circuit 260 includes low pass filters and high pass filters coupled together.

The low pass filters are configured to pass the DC components in the analog offset signals OFFSETP and OFFSETN. Specifically, in an embodiment, a resistor RR1 and a capacitor C1 form a first low pass filter to filter the analog offset signal OFFSETP to pass the DC component to the second amplifier 250; and a resistor RR3 and a capacitor C3 form a second low pass filter to filter the analog offset signal OFFSETN to pass the DC component to the second amplifier 250. In an example, the low pass filters are implemented using on-chip components. It is noted that, in another example, some components in the low pass filters are implemented using off chip components, such as external capacitors.

The high pass filters are configured to pass high frequency components in the pair of input signals INPUT_P and INPUT_N. Specifically, in an embodiment, a resistor RR2 and a capacitor C2 form a first high pass filter to filter the input signal OFFSETP to pass the high frequency components to the second amplifier 250; and a resistor RR4 and a capacitor C4 form a second high pass filter to filter the input signal OFFSETN to pass the high frequency components to the second amplifier 250. In an example, the high pass filters are implemented using on-chip components. It is noted that, in another example, some components in the high pass filters are implemented using off chip components, such as external capacitors.

The DC components in the pair of analog offset signals OFFSETP and OFFSETN and the high frequency components in the pair of input signals INPUT_P and INPUT_N are combined into input signals INP2 and INN2, and the input signals INP2 and INN2 are input to the second amplifier 250. The second amplifier 250 amplifies the input signals INP2 and INN2.

The outputs from the first amplifier 240 and the second amplifier 250 are suitably combined to cancel the DC offset in the first amplifier 240, and boost amplifying gain. Further, the combined outputs are provided to the latch 270 to detect the digital values. The latch 270 then outputs digital values based on the combined outputs. In an embodiment, the outputs are in the current form, and are suitably combined.

In an embodiment, the first amplifier 240, the second amplifier 250 and the latch 270 are integrated and implemented using a circuit 280 in a current-mode latch sense amplifier topology.

Figure 3:
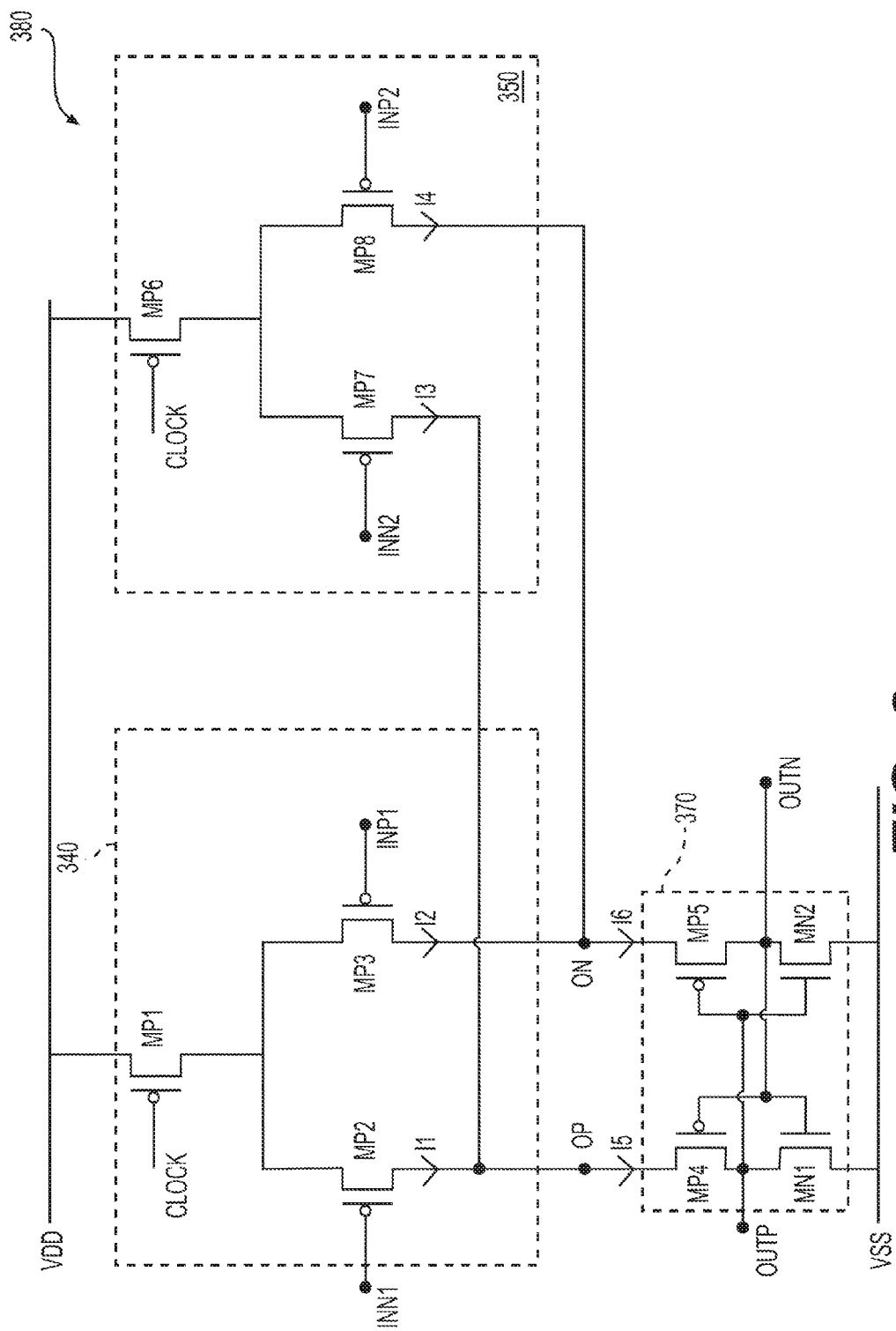
FIG. 3 shows a schematic diagram of circuit 380 in a current-mode latch sense amplifier topology according to an embodiment of the disclosure.

FIG. 3 shows a schematic diagram of a circuit 380 in a current-mode latch sense amplifier topology according to an embodiment of the disclosure. In an example, the circuit 380 is an implementation of the circuit 280 in a current-mode latch sense amplifier topology, and the circuit 380 is used in the sense amplifier 225 in the place of the circuit 280. The current-mode latch sense amplifier topology is also referred to as StrongARM latch topology to commemorate the use of the topology in Digital Equipment Corporation's StrongARM™ microprocessor. The circuit 380 includes a first amplifier 340, a second amplifier 350 and a latch circuit 370 coupled together between a first power rail VDD and a second power rail VSS as shown in FIG. 3. In an example, the first power rail VDD has a voltage level about 1V, and the second power rail VSS is ground.

In the FIG. 3 example, the first amplifier 340 is a clocked differential amplifier. The first amplifier 340 includes P-type transistors MP1-MP3 that are implemented using metal-oxide-semiconductor field-effect transistors (MOSFETs), and are coupled together as shown in FIG. 3. The P-type transistors MP2 and MP3 form a differential amplifier, and the P-type transistor MP1 is controlled by a clock signal CLOCK to control the operation of the differential amplifier.

For example, when the clock signal CLOCK is "1" (e.g., about VDD level), the P-type transistor MP1 is turned off to shut off power to the differential amplifier and disable the operation of the differential amplifier. When the clock signal CLOCK is "0" (e.g., about VSS level), the P-type transistor MP1 is turned on to provide power to the differential amplifier to enable operations of the differential amplifier.

In the FIG. 3 example, during operation when the clock signal CLOCK is about VSS level, the P-type transistors MP2 and MP3 respectively receives a first pair of input signals INN1 and INP1. In an example, the input signals INP1 and INN1 are complementary signals with a middle voltage of VDD/2. The P-type transistors MP2 and MP3 conduct current based on the polarity of the voltage difference ($V_{INP1}-V_{INN1}$) between the input signals INP1 and INN1. For example, when the polarity is positive, the current I1 that flows through the P-type transistor MP2 is larger than the current I2 that flows through the P-type transistor MP3; and when the polarity is negative, the current I1 that flows through the P-type transistor MP2 is smaller than the current I2 that flows through the P-type transistor MP3. In an example, the current difference of the current I1 and I2 is proportional to the voltage difference between the input signals INP1 and INN1.

The second amplifier 350 is also a clocked differential amplifier. The second amplifier 350 includes P-type transistors MP6-MP8 that are implemented using MOSFETs, and the P-type transistors MP6-MP8 are coupled together as shown in FIG. 3. The P-type transistors MP7 and MP8 form a differential amplifier, and the P-type transistor MP6 is controlled by the clock signal CLOCK to control the operation of the differential amplifier.

The second amplifier 350 operates similarly to the first amplifier 340. For example, during operation when the clock signal CLOCK is about VSS level the P-type transistors MP7 and MP8 respectively receives a second pair of input signals INN2 and INP2, and conduct current based on the polarity of the voltage difference ($V_{INP2}-V_{INN2}$) between the input signals INP2 and INN2. For example, when the polarity is positive, the current I3 that flows through the P-type transistor MP7 is larger than the current I4 that flows through the P-type transistor MP8; and when the polarity is negative, the current I3 that flows through the P-type transistor MP7 is smaller than the current I4 that flows through the P-type transistor MP8.

In an embodiment, the first amplifier 340 and the second amplifier 350 are implemented using transistors of different sizes. In an example, the P-type transistors MP2 and MP3 are implemented using transistors of larger width/length ratio than the P-type transistors MP7 and MP8, thus the first amplifier 340 has a larger gain than the second amplifier 350.

The latch circuit 370 includes P-type transistors MP4 and MP5, and N-type transistors MN1-MN2. The P-type transistor MP4 and the N-type transistor MN1 form a first inverter, and the P-type transistor MP5 and the N-type transistor MN2 form a second inverter. The first inverter and the second inverter are cross-coupled to form a current-mode latch.

According to an aspect of the disclosure, the first amplifier 340 is configured to be the main amplifier on a main amplifying path (e.g., the main amplifying path 127) and the second amplifier 350 is configured to be an offset amplifier on an offset amplifying path (e.g., the offset amplifying path 128). For example, the first pair of input signals INP1 and INN1 is a pair of differential signals that carries digital values, and the second pair of input signals INP2 and INN2 includes DC components to cancel random DC offset in the first amplifier 340. Further, in an embodiment, the second pair of input signals INP2 and INN2 includes high frequency components of the first pair of input signals INP1 and INN1 that are used to transmit the digital values. Thus, the second amplifier 350 acts as a feed forward equalizer in an embodiment.

The outputs of the first amplifier 340 and the second amplifier 350 are combined, and the combined outputs are provided to the latch circuit 370 to generate the output signals OUTP and OUTN. In the FIG. 3 example, the current I1 and I3 are combined into current I5, and the current I2 and I4 are combined into current I6. The current I5 and I6 are provided to the latch circuit 370 to generate the output signals OUTP and OUTN.

According to an aspect of the disclosure, the output signals are generated in response to a polarity of voltage difference between the input signals INP1 and INN1. In an example, the output signals OUTP and OUTN are differential signals with the rail voltage levels, such as VDD and VSS.

During operation, in an example, when the clock signal CLOCK is "1" (e.g., about VDD level), the P-type transistors MP1 and MP6 are turned off, no power is provided to the first amplifier 340 and the second amplifier 350, the voltage difference between nodes OP and ON is about zero, and the voltage difference between the output signals OUTP and OUTN is about zero. For example, the voltage at the nodes OUTP and OUTN is about VSS level.

When the clock signal CLOCK is "0" (e.g., about VSS level), the P-type transistors MP1 and MP6 are turned on to provide power to the first amplifier 340 and the second amplifier 350. The first amplifier 340 generates the current I1 and the current I2 in response to the input signals INP1 and INN1, and the second amplifier 350 generates the current I3 and I4 in response to the input signals INP2 and INN2.

The current I1 and I3 are combined into current I5, and the current I2 and I4 are combined into the current I6 to cancel the offset in the first amplifier 340. The current I5 charges node OP and the current I6 charges node ON. In an example, when the polarity of the voltage difference ($V_{INP1}-V_{INN1}$) between the input signals INP1 and INN1 is positive, the current I5 is larger than the current I6, the voltage at the node OP rises faster than the voltage at the node ON, and the P-type transistor MP4 turns on sooner than the P-type transistor MP5. Thus, the output signal OUTP is pulled up to about VDD level. Due to the cross-coupled inverters, the output signal OUTN is pulled down to about VSS level.

In the example, when the polarity of the voltage difference ($V_{INP1}-V_{INN1}$) between the input signals INP1 and INN1 is negative, the current I5 is smaller than the current I6, the voltage at the node ON rises faster than the voltage at the node OP, and the P-type transistor MP5 turns on sooner than the P-type transistor MP4. Thus, the output signal OUTN is pulled up to about VDD level. Due to the cross-coupled inverters, the output signal OUTP is pulled down to about VSS level.

It is noted that, in some embodiments, the circuit 380 is modified to use other suitable topology. Further, in an example, the circuit 380 includes other suitable circuit. For example, an additional latch (not shown) or flip-flop circuit (not shown) or a buffer circuit (not shown) is used to sample states of the output signals OUTP and OUTN, and store and maintain the sampled states, for example when the clock signal CLOCK is "1" (e.g., about VDD level).

Figure 4:
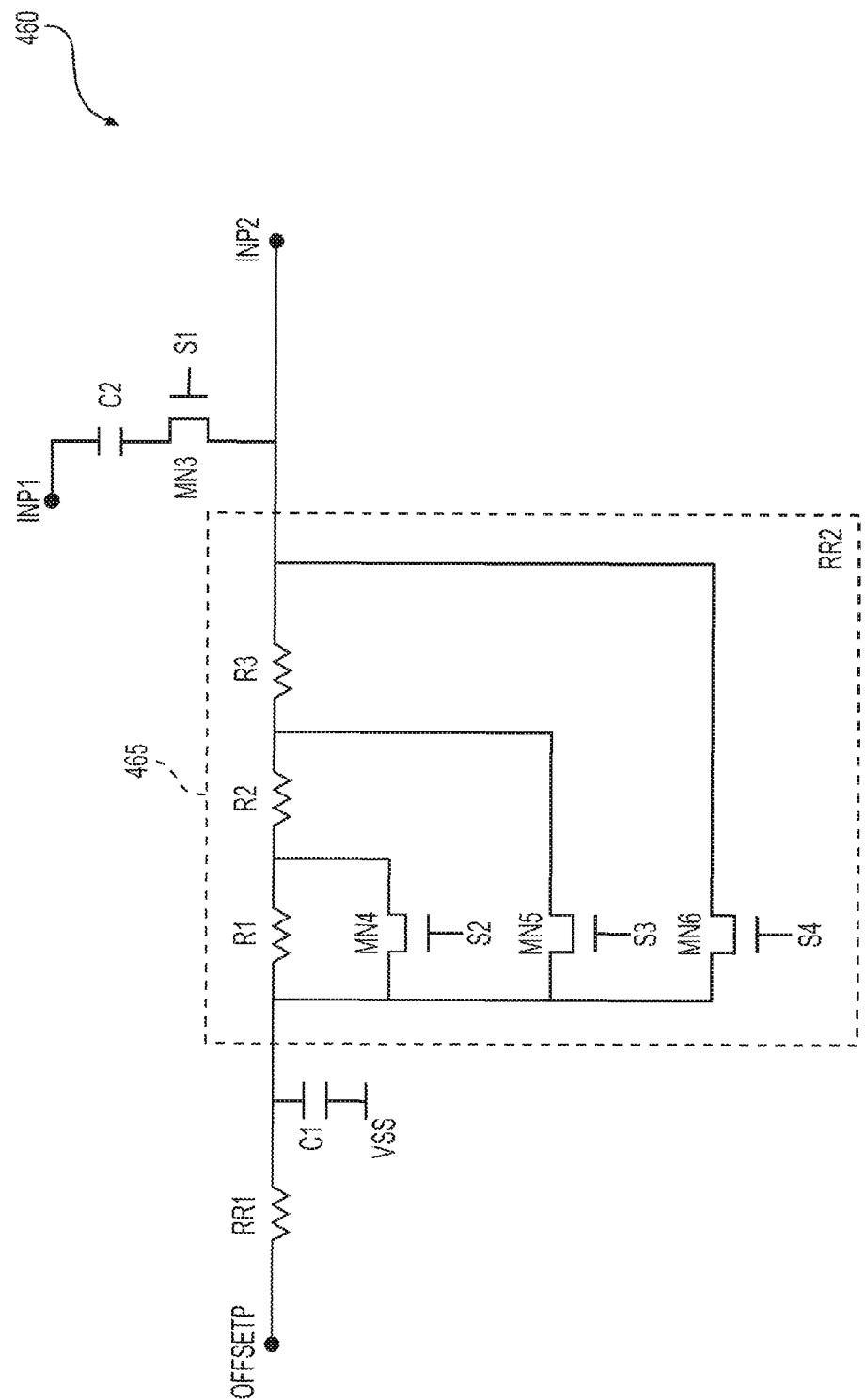
FIG. 4 shows a schematic diagram of a coupling circuit 460 according to an embodiment of the disclosure.

FIG. 4 shows a schematic diagram of a coupling circuit 460 according to an embodiment of the disclosure. In an example, the coupling circuit 460 is used in the sense amplifier 225 in the place of the coupling circuit 260. FIG. 4 shows a portion of the coupling circuit 460 that combines the input signal INP1 and the offset signal OFFSETP to generate the input signal INP2. The coupling circuit 460 also includes another portion (not shown) that combines the input signal INN1 and the offset signal OFFSETP to generate the input signal INN2. The other portion is identical or equivalent to the portion shown in FIG. 4.

The coupling circuit 460 includes a resistor RR1, capacitors C1 and C2, a switch MN3, and a configurable resistor 465 coupled together as shown in FIG. 4. The configurable resistor 465 includes resistors R1-R3 and switches MN4-MN6 coupled together as shown in FIG. 4. In an example, the switches MN3-MN6 are implemented using N-type MOSFET transistors.

In the FIG. 4 example, the coupling circuit 460 receives control signals S1-S4, and is configured to have different coupling characteristics based on the control signals S1-S4.

For example, when the control signal S1 is "1" (e.g., about VDD level), the switch MN3 is closed to be conductive, thus the capacitor C2 and the configurable the resistor 465 form a high pass filter to pass high frequency components in the input signal INP1. The capacitor C1 and the resistor RR1 form a low pass filter to pass the DC component in the offset signal OFFSETP. The DC component in the offset signal OFFSETP, and the high frequency components in the input signal INP1 are combined to generate the input signal INP2.

When the control signal S1 is "0" (e.g., about VSS level), the switch MN3 is open to separate the input signal INP2 from the input signal INP1. In an example, at a calibration time to calibrate the offset of an amplifier that amplifies the input signals INP1 and INN1, the switch MN3 is controlled to be open.

Further, in the FIG. 4 example, the switches MN4-MN6 are used to adjust the resistance for the configurable resistor 465, and thus to control the pass band for the high pass filter. For example, when the switches MN4-MN6 are closed, the cutoff frequency of the high pass filter is high; and when the switches MN4-MN6 are open, the cutoff frequency of the high pass filter is low.

Figure 5:
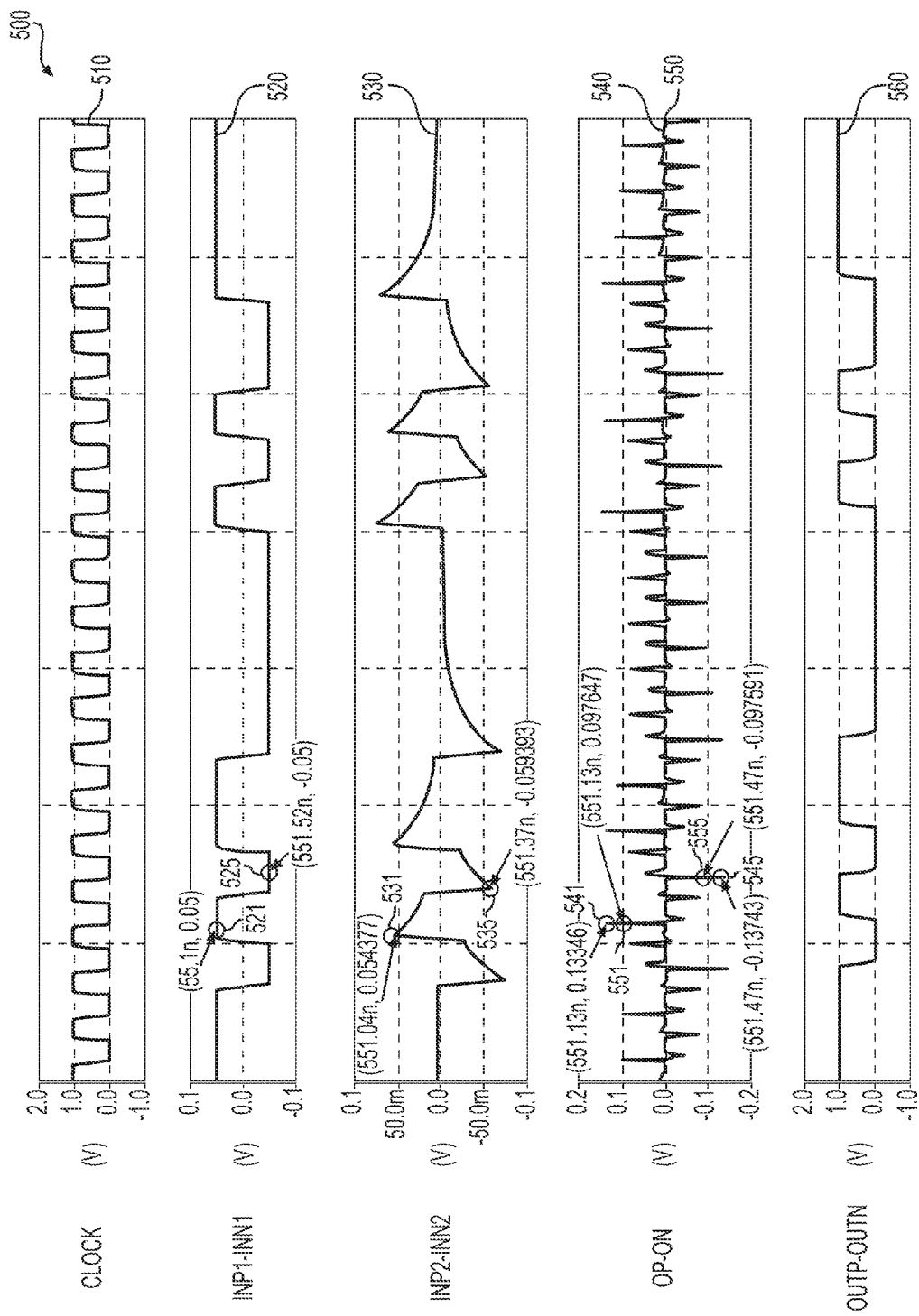
FIG. 5 shows a plot 500 of waveforms according to an embodiment of the disclosure.

FIG. 5 shows a plot 500 of waveforms from a simulation of the sense amplifier 225 that is implemented using the circuit 380 and the coupling circuit 460 according to an embodiment of the disclosure. The simulation is performed using Cadence® Spectre® Circuit Simulator.

The plot 500 includes a first waveform 510 for the clock signal CLOCK, a second waveform 520 for the voltage difference between the input signals INP1 and INN1, a third waveform 530 for the voltage difference between the input signals INP2 and INN2, a fourth waveform 540 for the voltage difference at node OP and node ON when the control signal S1 is "1", a fifth waveform 550 for the voltage difference at node OP and node ON when the control signal S1 is "0", and a sixth waveform 560 for the buffered OUTP.

As shown by the second waveform 520, the voltage difference between the input signals INP1 and INN1 transits between positive polarity and negative polarity to carry digital values. For example, at a first transit time shown by 521, the voltage difference between the input signals INP1 and INN1 is about 0.05V having a positive polarity, at a second transit time shown by 525, the voltage difference between the input signals INP1 and INN1 is about -0.05V having a negative polarity.

As shown by the third waveform 530, due to the transitions in the input signals that carry digital values and due to the coupling by the high pass filters, the voltage difference between the input signals INP2 and INN2 has peak/valley values as shown by 531 and 535. For example, the voltage difference between the input signals INP2 and INN2 is about 0.054V at peak for the positive polarity as shown by 531, and is about -0.059V for the negative polarity as shown by 535.

As shown by the fourth waveform 540 and the fifth waveform 550, due to coupling circuit 460 that behaves similarly to the feed forward equalizer when the control signal S1 is "1", the voltage difference at the nodes OP and ON has larger absolute values at transition times, when the control signal S1 is "1" as shown by 541 and 545, than the voltage difference when the control signal S1 is "0", as shown by 551 and 555.

As shown by the sixth waveform 560, the latch circuit 370 correctly detects the digital values, and the outputs from the latch circuit 370 has rail to rail voltage levels, such as about 1V for the high voltage level, and about ground for the low voltage level.

Figure 6:
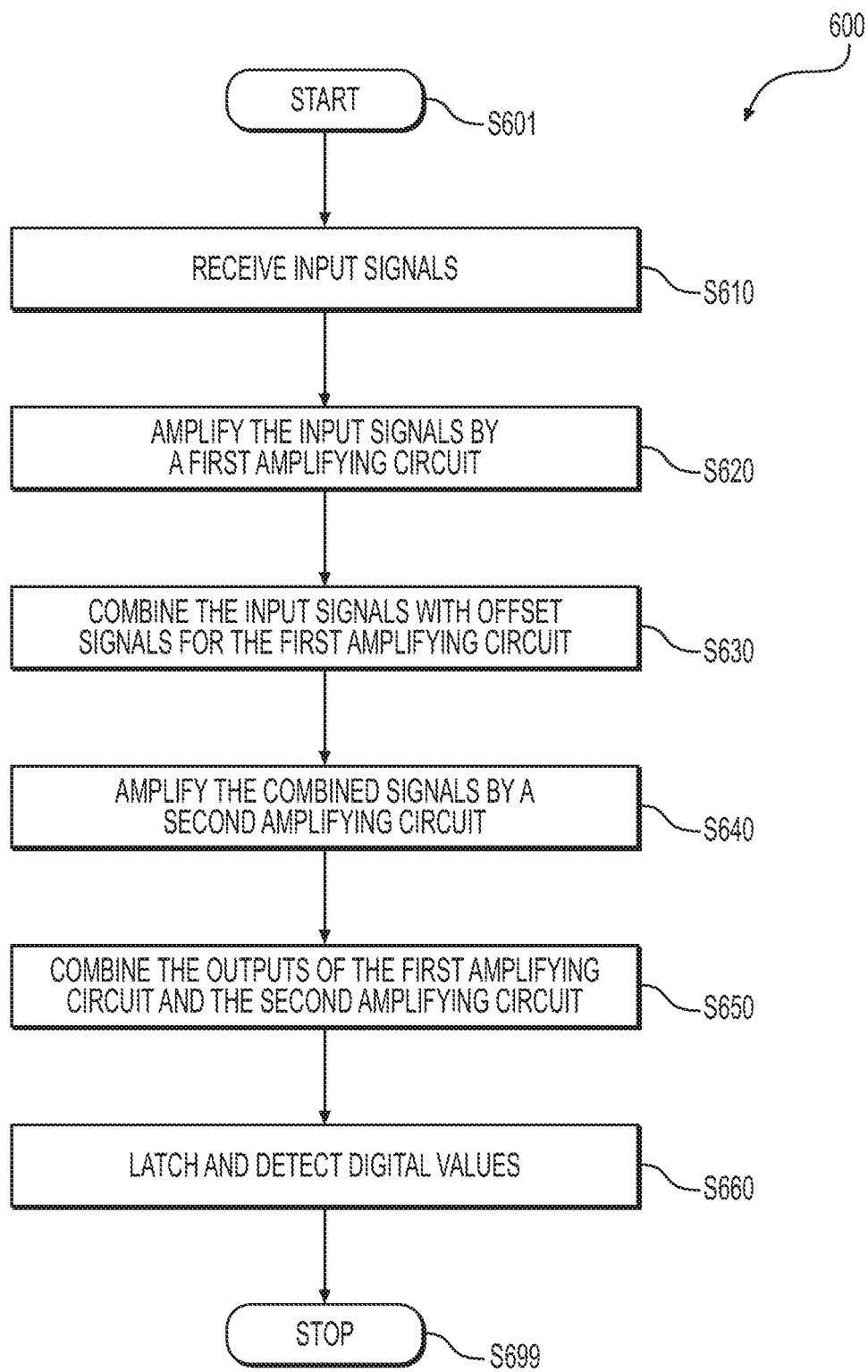
FIG. 6 shows a flow chart outlining a process 600 according to an embodiment of the disclosure.

FIG. 6 shows a flow chart outlining a process 600 according to an embodiment of the disclosure. In an example, the process is executed by a sense amplifier, such as the sense amplifier circuit 125 in FIG. 1, the sense amplifier 225 in FIG. 2, and the like. In the FIG. 2 example, the sense amplifier 225 includes the first amplifier 240, the second amplifier 250, the coupling circuit 260 and the latch circuit 270. In an example, the first amplifier 240, the second amplifier 250 and the latch circuit 270 are implemented according to the circuit 380; and the coupling circuit 260 is implemented according to the coupling circuit 460. The process starts at S601 and proceeds to S610.

At S610, an input signal is received. In the FIG. 2 example, the sense amplifier 225 receives a pair of input signals INP1 and INN1 that are differential signals carrying digital values.

At S620, the input signal is amplified by a first amplifying circuit. In the FIG. 2 example, the first amplifier 240 receives the pair of the input signals INP1 and INN1, and amplifies in response to the voltage difference to generate output signal OUTPUT1. In an example, the first amplifier 240 is implemented using the first amplifier 340 in FIG. 3, the first amplifier 340 generates the current I1 and I2 in response to the input signals INP1 and INN1. In an example, the current difference between the current I1 and I2 is proportional to the voltage difference between the input signals INP1 and INN1.

At S630, the input signal is combined with an offset signal for the first amplifying circuit. In the FIG. 2 example, the coupling circuit 260 includes the high pass filters to pass high frequency components in the input signals INP1 and INN1, and includes the low pass filters to pass DC component in the offset signal. The high frequency components in the input signals INP1 and INN1 and the DC component in the offset signal are combined into the input signals INP2 and INN2.

At S640, the combined signals are amplified by a second amplifying circuit. In the FIG. 2 example, the second amplifier 250 receives the input signals INP2 and INN2, and amplifies in response to the input signals INP2 and INN2 to generate output signal OUTPUT2. In an example, the second amplifier 250 is implemented using the second amplifier 350 in FIG. 3, the second amplifier 350 generates the current I3 and I4. In an example, the current difference between the current I3 and I4 is proportional to the voltage difference between the input signals INP2 and INN2.

At S650, the outputs from the first amplifying circuit and the second amplifying circuit are combined. For example, the current I1 and I3 are combined into the current I5, and the current I2 and I4 are combined into the current I6.

At S660, digital values are detected. In an example, the current I5 and I6 are used to trigger the latch circuit 370 to operate and latch a digital value. The digital value is buffered and output. Then the process proceeds to S699 and terminates.

It is noted that the process 600 is performed by circuit components. In an example, steps in the process 600 are performed by different circuit components at about the same time.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A sense amplifier, comprising:
  a first amplifying circuit configured to receive an input signal that carries digital values and amplify the input signal to generate a first output;
  a coupling circuit configured to combine the input signal with an offset signal to form a combined signal, the offset signal being used to cancel an offset of the first amplifying circuit;
  a second amplifying circuit configured to receive the combined signal of the input signal and the offset signal and amplify the combined signal to generate a second output; and
  a detection circuit configured to detect the digital values based on a combined output of the first output and the second output.

2. The sense amplifier of claim 1, wherein the coupling circuit comprises:
  a high pass filter configured to pass frequency components in the input signal that are higher than a cutoff frequency.

3. The sense amplifier of claim 2, wherein the coupling circuit comprises:
  a low pass filter configured to pass a direct current (DC) component in the offset signal, the DC component in the offset signal and the passed frequency components in the input signal are combined to form the combined signal.

4. The sense amplifier of claim 1, wherein:
  the first amplifying circuit is configured to generate a first current in response to input signal;
  the second amplifying circuit is configured to generate a second current in response to the combined signal; and
  the detection circuit is configured to detect the digital values based on a combined current of the first current and the second current.

5. The sense amplifier of claim 1, wherein the detection circuit comprises:
  two cross-coupled inverters that form a latch.

6. The sense amplifier of claim 5, wherein the first amplifying circuit includes a first differential amplifier, the second amplifying circuit includes a second differential amplifier, the first differential amplifier and the second differential amplifier are coupled with the latch.

7. The sense amplifier of claim 1, further comprising:
  a storage memory configured to store offset information of the first amplifying circuit in a digital form; and
  a digital to analog converter configured to generate the offset signal in an analog form based on the stored offset information in the digital form.

8. A method for receiving and detecting digital values, comprising:
  receiving an input signal that carries digital values;
  amplifying the input signal, by a first amplifying circuit, to generate a first output;
  combining the input signal with an offset signal to form a combined signal, the offset signal being used to cancel an offset of the first amplifying circuit;
  amplifying the combined signal, by a second amplifying circuit, to generate a second output;
  combining the first output and the second output to form a combined output; and
  detecting the digital values based on the combined output.

9. The method of claim 8, wherein combining the input signal with the offset signal that is used to cancel the offset of the first amplifying circuit to form the combined signal comprises:
  filtering the input signal to pass frequency components in the input signal that are higher than a cutoff frequency.

10. The method of claim 9, wherein combining the input signal with the offset signal that is used to cancel the offset of the first amplifying circuit to form the combined signal further comprises:
  filtering the offset signal to pass a direct current (DC) component in the offset signal; and
  combining the DC component in the offset signal and the passed frequency components in the input signal to form the combined signal.

11. The method of claim 8, comprising:
  generating, by the first amplifying circuit, a first current in response to input signal;
  generating by the second amplifying circuit, a second current in response to the combined signal;
  combining the first current and the second current to form a combined current; and
  detecting the digital values based on the combined current.

12. The method of claim 8, wherein detecting the digital values based on the combined output comprises:
  latching the digital values using two cross-coupled inverters.

13. The method of claim 8, further comprising:
  storing offset information of the first amplifying circuit in a digital form; and
  converting the offset information from the digital form to an analog form to generate the offset signal.

14. An apparatus, comprising:
  a serializer/deserializer (SERDES) circuit that comprises:
    a receiver circuit configured to receive input signals and detect digital vales carried in the input signals, wherein the receiver circuit comprises a sense amplifier that includes:
      a first amplifying circuit configured to receive the input signals and amplify the input signals to generate first outputs;
      a coupling circuit configured to combine the input signals with offset signals to form combined signals, the offset signals being used to cancel an offset of the first amplifying circuit;
      a second amplifying circuit configured to receive the combined signals and amplify the combined signals to generate second outputs; and a detection circuit configured to detect digital values based on combined outputs of the first outputs and the second outputs.

15. The apparatus of claim 14, wherein the coupling circuit comprises:
a high pass filter configured to pass frequency components in the input signals that are higher than a cutoff frequency.

16. The apparatus of claim 15, wherein the coupling circuit comprises:
a low pass filter configured to pass a direct current (DC) component in the offset signals, the DC component in the offset signals and the passed frequency components in the input signals are combined to form the combined signals.

17. The apparatus of claim 14, wherein:
the first amplifying circuit is configured to generate first currents in response to input signals;
the second amplifying circuit is configured to generate second currents in response to the combined signals; and
the detection circuit is configured to detect the digital values based on combined currents of the first currents and the second currents.

18. The apparatus of claim 14, wherein the detection circuit comprises:
two cross-coupled inverters that form a latch.

19. The apparatus of claim 18, wherein the first amplifying circuit includes a first differential amplifier, the second amplifying circuit includes a second differential amplifier, the first differential amplifier and the second differential amplifier are coupled with the latch.

20. The apparatus of claim 14, further comprising:
a storage memory configured to store offset information of the first amplifying circuit in a digital form; and
a digital to analog converter configured to generate the offset signals in an analog form based on the stored offset information in the digital form.

* * * * *